United States Patent
Yeh

(10) Patent No.: US 7,588,452 B2
(45) Date of Patent: Sep. 15, 2009

(54) ELECTRICAL CONNECTOR ASSEMBLY WITH FASTENING DEVICE

(75) Inventor: Cheng-Chi Yeh, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/321,266

(22) Filed: Jan. 16, 2009

(65) Prior Publication Data
US 2009/0186513 A1 Jul. 23, 2009

(30) Foreign Application Priority Data
Jan. 17, 2008 (CN) .................... 2008 2 0030696 U

(51) Int. Cl.
*H01R 13/62* (2006.01)
(52) U.S. Cl. ..................................... 439/331
(58) Field of Classification Search ................ 439/135, 439/940, 941, 331
See application file for complete search history.

(56) References Cited

U.S. PATENT DOCUMENTS

| 6,877,990 | B2 | | 4/2005 | Liao et al. | |
| 7,247,041 | B2 | | 7/2007 | Ma et al. | |
| 7,247,043 | B2 | * | 7/2007 | Lai | 439/331 |
| 7,264,487 | B2 | * | 9/2007 | Liao | 439/135 |
| 7,390,202 | B2 | * | 6/2008 | Ma et al. | 439/135 |
| 2008/0045048 | A1 | * | 2/2008 | Ma | 439/73 |
| 2009/0104794 | A1 | * | 4/2009 | Ma | 439/66 |

* cited by examiner

*Primary Examiner*—Neil Abrams
*Assistant Examiner*—Phuong Nguyen
(74) *Attorney, Agent, or Firm*—Wei Te Chung

(57) ABSTRACT

An electrical connector (100) adapted for electrically connecting a chip module to a printed circuit board, includes an insulative housing (30) having a plurality of terminals received therein and a fastening device (90). The fastening device (90) comprises a stiffener (50) surrounding the insulative housing (30), a load plate (60) pivotally assembled to an end of the stiffener (50), and a knob (70) assembled on an opposed end of the stiffener (50) for locking the load plate (60). The knob (70) has a stem (702) rotationally provided with a guiding slot (704) helically defined along the stem (702) such that the tongue (610) of the load plate (60) engaged with the guiding slot (704) can be moved up and down when the knob (70) is rotated clockwise and counterclockwise.

13 Claims, 7 Drawing Sheets

ELECTRICAL CONNECTOR ASSEMBLY WITH FASTENING DEVICE

BACKGROUND OF THE INVENTION

1. Field of the Invention

The present invention relates to the art of electrical connectors, and more particularly to a land grid array (LGA) connector with a fastening device with a knob thereof. The fastening device with the knob provided with helical structure can be able to press against a tab of a load plate from the connector gradually to a locked position and simplify the structure of the electrical connector assembly and providing a mechanically and electrically connection between a chip module and a printed circuit board (PCB).

2. Description of the Prior Art

Electrical connectors are widely used for electrically connecting a chip module to a printed circuit board (PCB) in personal computer. Conventionally, an LGA electrical connector mainly comprises an insulative housing, a multiplicity of terminals received in the insulative housing, a metal stiffener surrounding the insulative housing, a load plate pivotally attached to one end of the metal stiffener for pressing the chip module and a lever pivotally attached to an opposite end of the metal stiffener for locking the load plate on the metal stiffener. The LGA electrical connector further includes four washers assembled on four corners of the metal stiffener.

The stiffener is substantially rectangular and comprises a base, a front sidewall extending upwardly from the base for securing the load plate, a back sidewall also extending upwardly from the base for connecting the lever, and a pair of lateral sidewalls upwardly extending from the opposed lateral edges of the base and located between the front sidewall and the back sidewall. The stiffener further defines four circular through holes at corners of the base for retaining the four washers.

U.S. Pat. No. 7,247,041 issued to Ma and Chen on Jul. 24, 2007 discloses a relevant prior LGA connector for electrically connecting an IC package and a printed circuit board. The LGA connector includes an insulative housing or body of a generally rectangular shape, a plurality of conductive terminals held within the insulative housing, a stiffener defining an opening for surrounding a periphery edge of the insulative housing, and a retention structure attached to the stiffener for providing a downward force towards the IC package on the insulative housing so as to establish a reliable interconnection between the IC package and the printed circuit board through the LGA connector. In this LGA connector, the retention structure includes a pressing cover and a lever respectively attached to opposite ends of the stiffener.

However, in these prior designs, when the electrical connector assembly is oriented to a closed position, there usually requires the lever to lock the load plate or the pressing cover on the stiffener. So when the electrical connector assembly is assembled on the printed circuit board, the printed circuit board needs to provide a certain space for the lever. Thus it does not well satisfy the miniaturization trend of the electrical connector assembly. In addition, the electrical connector assembly needs a fastening member to fix the lever on the stiffener. Thereby structure of the electrical connector assembly is complicated, and corresponding manufacturing process is complex.

Thus, there is a need to provide an improved electrical connector and fastening device with a knob thereof that overcomes the above-mentioned problems.

SUMMARY OF THE INVENTION

Accordingly, an object of the present invention is to provide an electrical connector with a fastening device which has a knob thereof for reducing an occupying area on the print circuit board.

To fulfill the above-mentioned object, an improved fastening device for retaining a chip module to a printed circuit board comprises a stiffener, a load plate pivotally assembled to a first end of the stiffener, and a knob assembled on a second end of the stiffener for locking the load plate. The stiffener is adapted for assembling on the printed circuit board and defines a base defining an opening for receiving an insulative housing. The load plate has a pressing side with a tongue. The knob has a stem rotationally provided with a guiding slot helically defined along the stem such that the tongue of the load plate engaged with the guiding slot can be moved up and down when the knob is rotated clockwise and counterclockwise.

There is also provides an improved electrical connector uses this fastening device for electrically connecting a chip module to a printed circuit board. The electrical connector further includes an insulative housing having a plurality of terminals received therein and the fastening device. The fastening device comprises a stiffener surrounding the insulative housing, a load plate pivotally assembled to a first end of the stiffener, and a knob assembled on a second end of the stiffener for locking the load plate. The stiffener is adapted for assembling on the printed circuit board and defines a base having an opening for receiving the insulative housing. The load plate has a pressing side with a tongue. The knob has a stem rotationally provided with a guiding slot helically defined along the stem such that the tongue of the load plate engaged with the guiding slot can be moved up and down when the knob is rotated clockwise and counterclockwise.

Other objects, advantages and novel features of the present invention will become more apparent from the following detailed description when taken in conjunction with the accompanying drawings, in which:

DETAILED DESCRIPTION OF THE INVENTION

Figure 1:
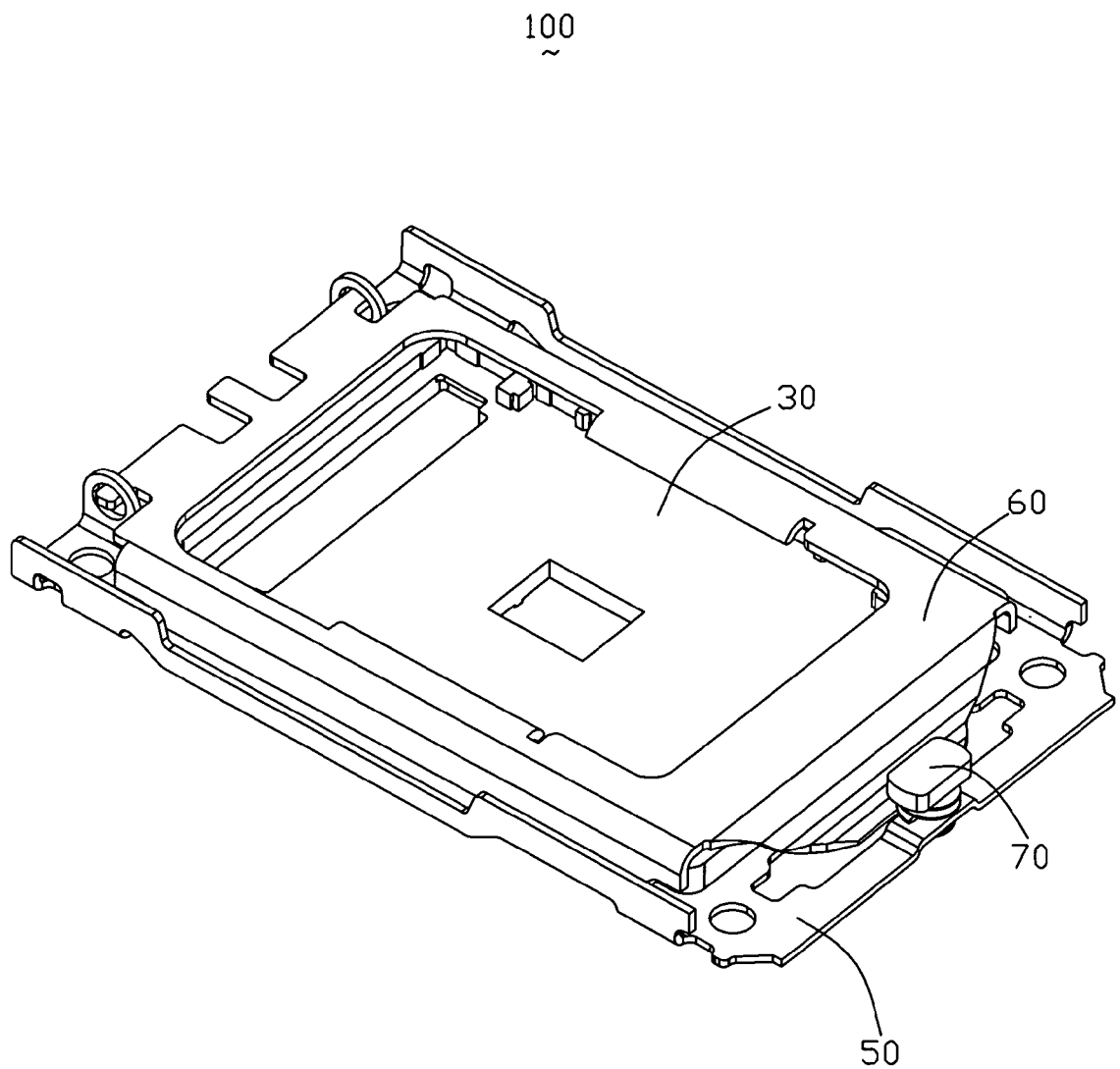
FIG. 1 is an assembled, isometric view of an electrical connector in accordance with a preferred embodiment of the present invention.

Reference will now be made to the drawing figures to describe the preferred embodiment of the present invention in detail.

Figure 2:
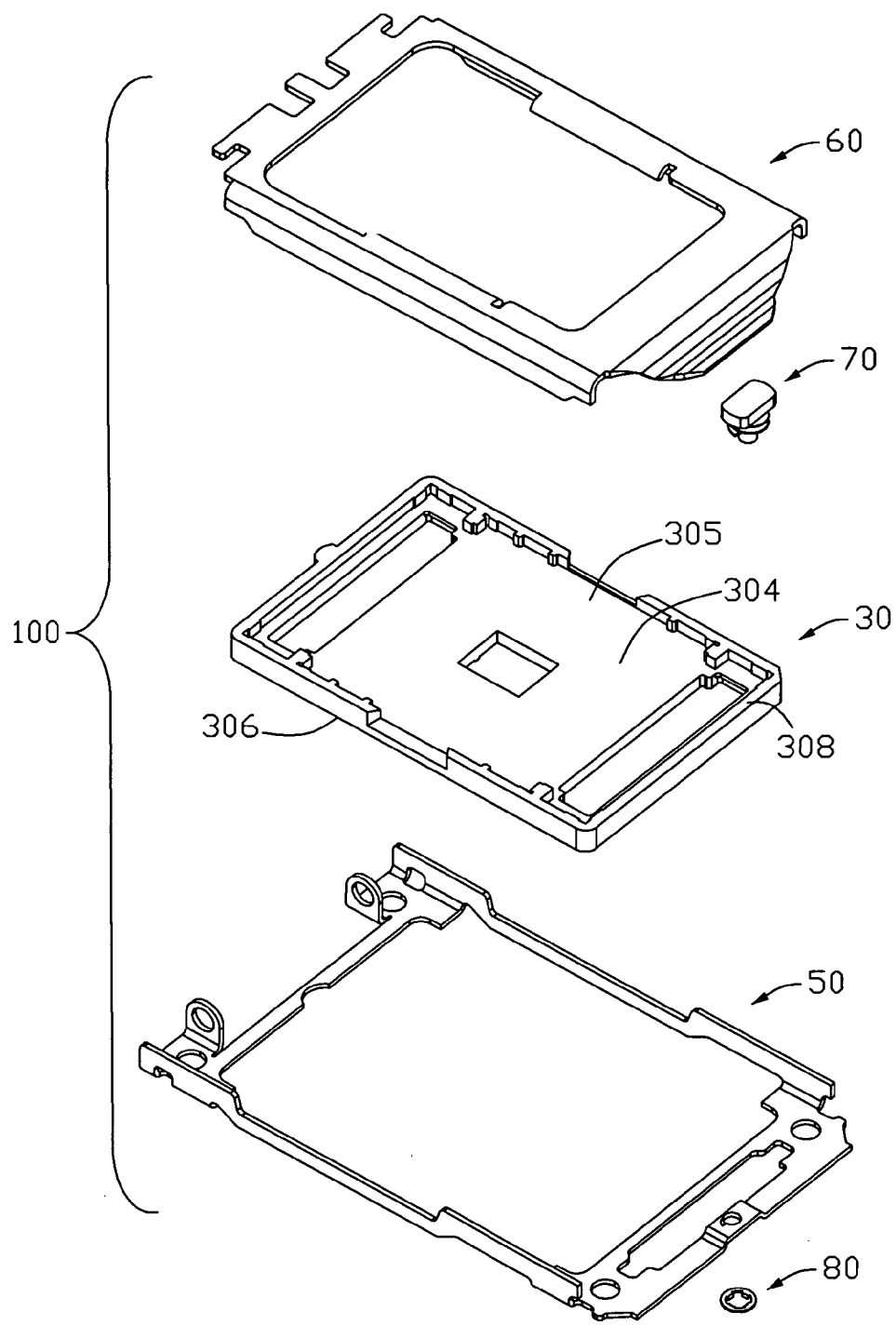
FIG. 2 is an exploded, isometric view of the electrical connector in accordance with the preferred embodiment of the present invention.
Figure 3:
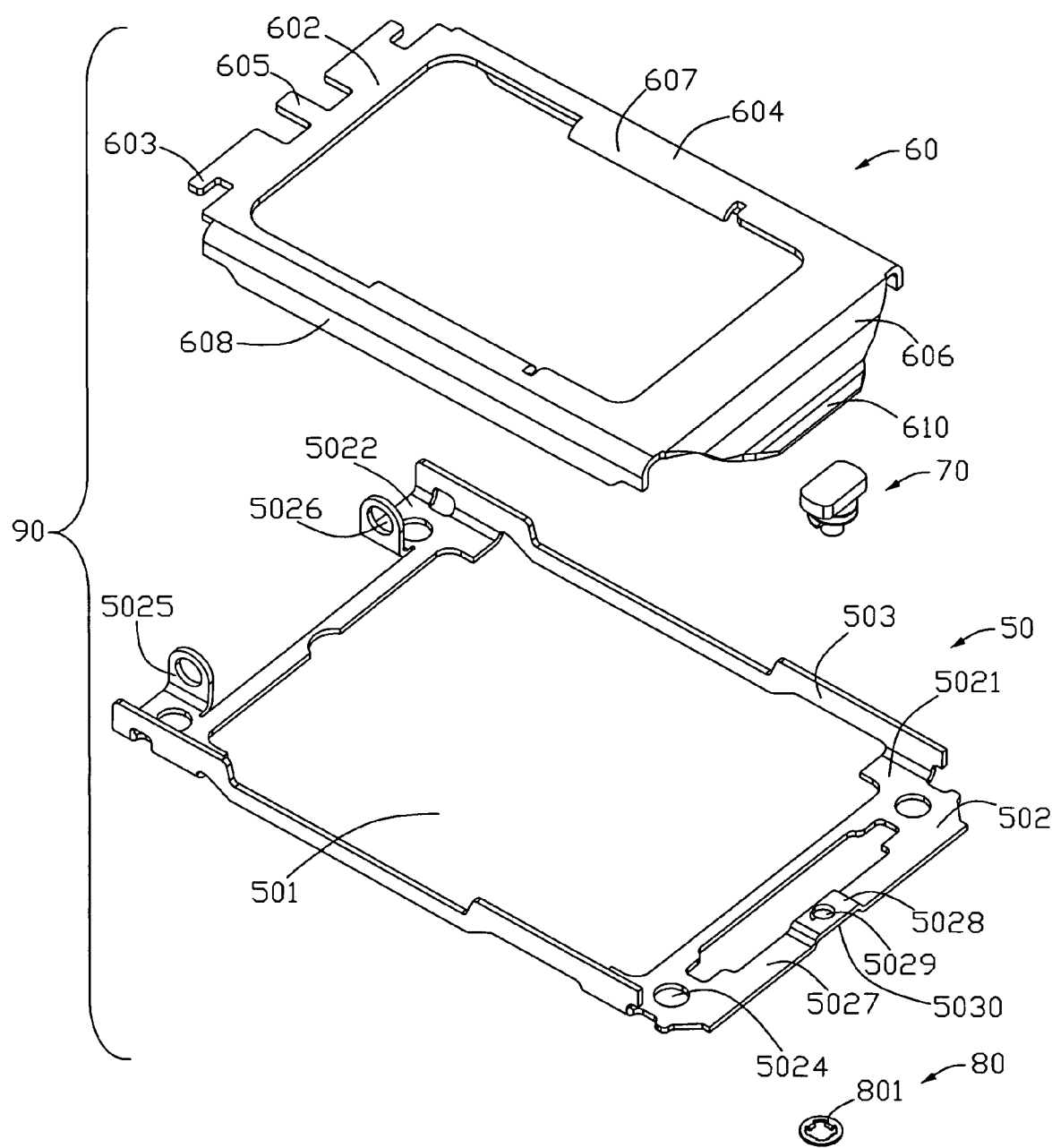
FIG. 3 is an exploded, isometric view of a fastening device of the electrical connector in accordance with the preferred embodiment of the present invention.
Figure 4:
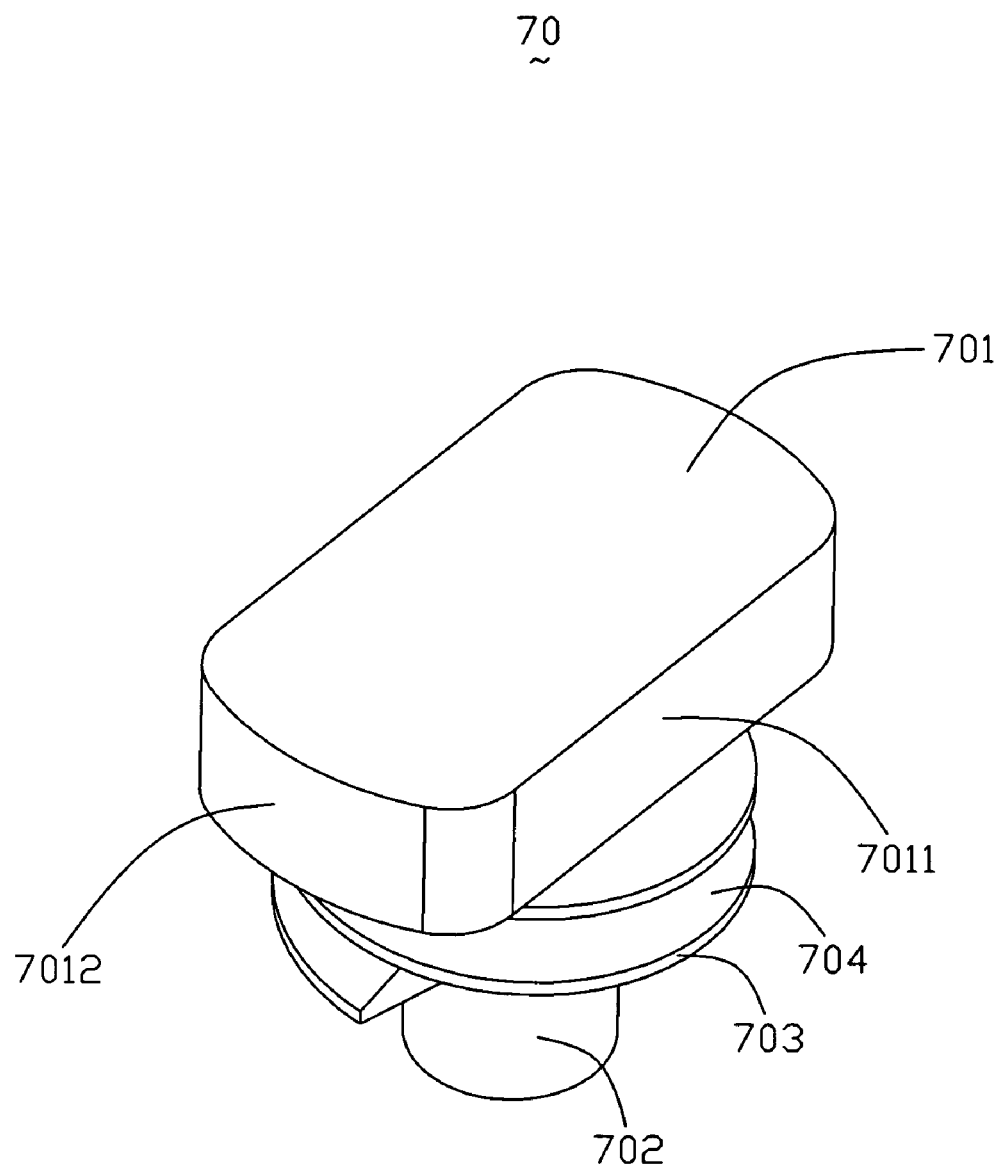
FIG. 4 is an isometric view of a knob of the fastening device shown in FIG. 3.
Figure 5:
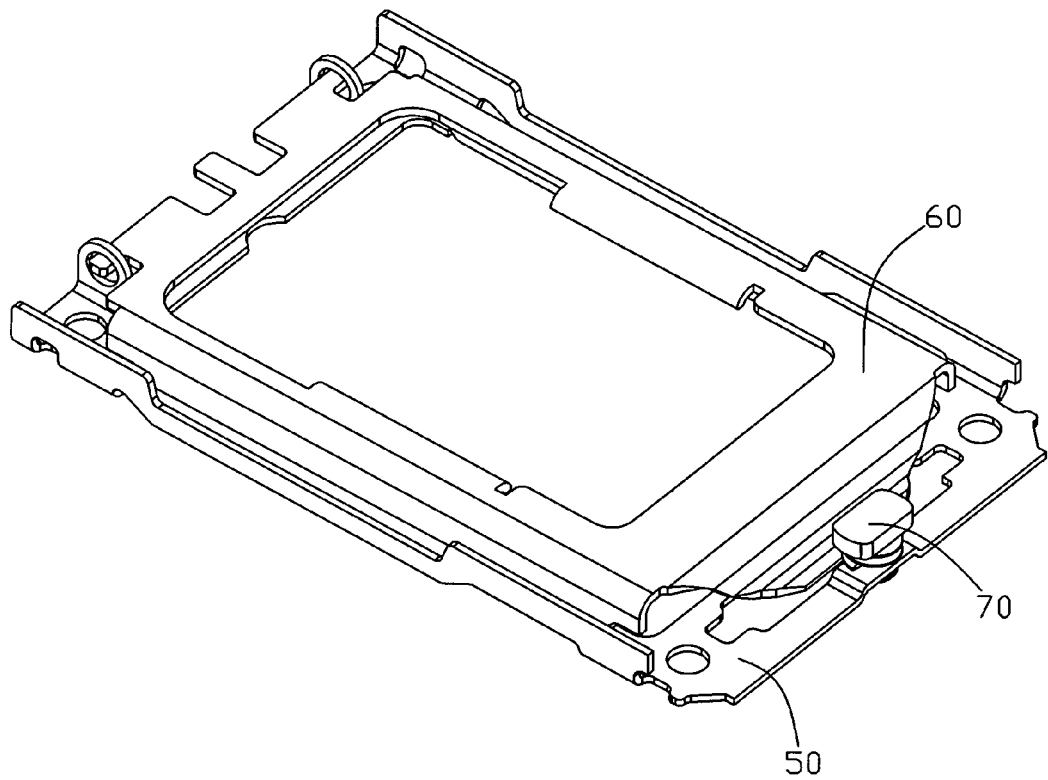
FIG. 5 is an assembled, isometric view of the fastening device shown in FIG. 3.
Figure 6:
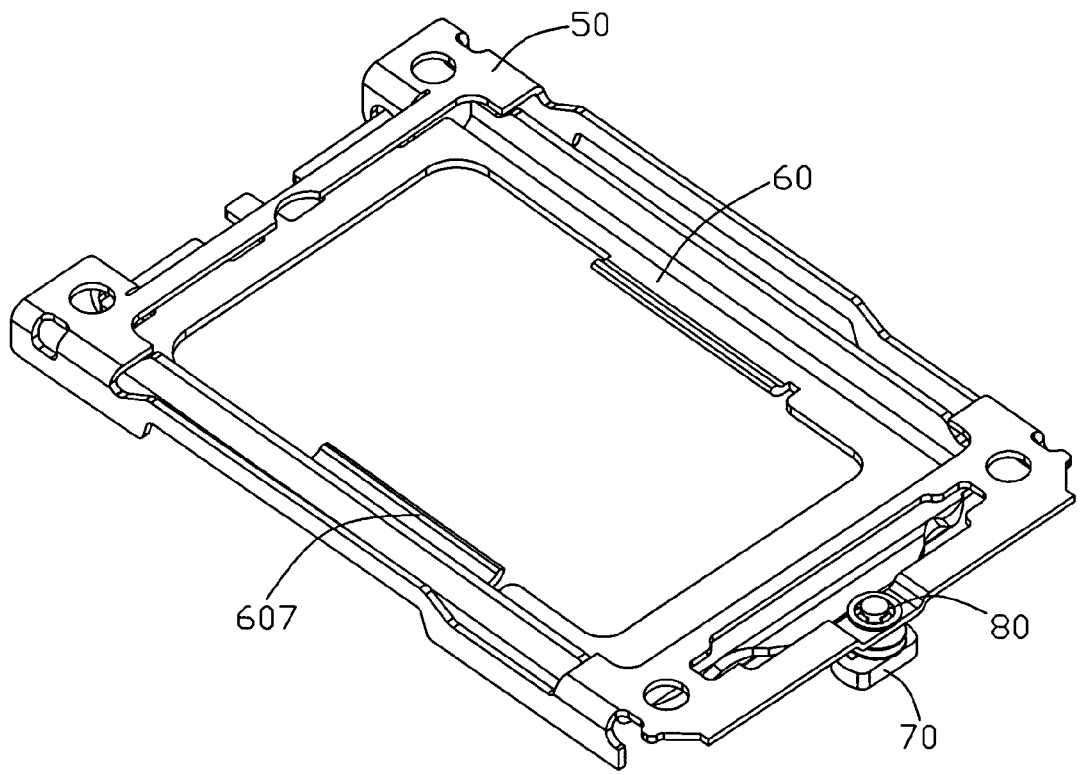
FIG. 6 is another assembled, isometric view of the fastening device taken from a bottom side.

Referring to FIGS. 1-2, an LGA electrical connector 100 adapted for electrical connecting the chip module (not shown) to the printed circuit board (not shown), includes an insulative housing 30 with a plurality of contacts (not shown), a fastening device 90 is surrounding the insulative housing 30. The fastening device 90 includes a stiffener 50 being assembled on the printed circuit board (not shown), a load plate 60 pivotally attached to a first end of the stiffener 50 for pressing the chip module (not shown), and a knob 70 separately assembled on an opposite second end of the stiffener 50 for locking the load plate 60, and a fixing ring 80 located on a bottom of the stiffener 50 for fastening the knob 70 on the stiffener 50.

Referring to FIGS. 3-6, the stiffener 50 is substantially rectangular shape and comprises a base 502, an opening 501 defined in the center of the base 502 for receiving the insulative housing 30, and a pair of parallel lateral sides 503 extending upwardly from the base 502. The base 502 includes a first main portion 5021 for fastening the knob 70 and a second main portion 5022 for jointing with the load plate 60. Both the first main portion 5021 and the second main portion 5022 define two circular through holes 5024 at two opposed ends thereof. The second main portion 5022 further has a pair of fastening portions 5025 extending upwardly from the edges of the through holes 5024 for jointing with one end of the load plate 60. Each of the two fastening portions 5025 defines a fastening hole 5026 in a middle thereof and is parallel to the lateral sides 503. The first main portion 5021 further has a projecting portion 5028 in a middle of a front side 5027 of the base 502. So there is a gap 5030 formed between the projecting portion 5028 and the printed circuit board (not shown) for receiving the fixing ring 80.

The load plate 60 is a metal frame. The load plate 60 includes a retaining side 602 adapted for attaching to the stiffener 50, a pressing side 606 opposite to the retaining side 602, and a pair of sidewalls 604 connecting the retaining side 602 and the pressing side 606. The retaining side 602 provides a pair of hooks 603 extending from the retaining side 602. Each hook 603 is in a shape of L and able to pass through the fastening hole 5026 of the fastening portion 5025 of the stiffener 50. A stopper 605 is formed between the two hooks 603 for abutting against the stiffener 50 to prevent the load plate 60 from over rotation. The pressing side 606 has a curve tongue 610 at a middle thereof extending downwardly for engaging with the knob 70. Each sidewall 604 defines a urging portion 607 extending downwardly at the middle thereof for pressing the chip module (not shown). A pair of downwardly bent portions 608 is formed at an outside edge of the side wall 604.

The knob 70 comprises a tabular driving portion 701, a stem 702 extending downwardly from the bottom of the driving portion 701, and screwing stripes 703 formed on the surface of the stem 702. The driving portion 701 defines a rectangular basic portion 7011 and an embowed end portion 7012 extending forwardly from the basic portion 7011. The stem 702 has a column bottom end. There is a continuous guiding slot 704 formed between the adjacent wrest stripes 703 on the periphery of the stem 702. The guiding slot 704 is able to guide and drive the pressing side 606 of the load plate 60 to move downwardly to a close position along the knob 70 by circumrotating the knob 70. The tongue 610 of the load plate 60 engaged with the guiding slot 704 can be moved up and down when the knob 70 is rotated clockwise and counterclockwise. The load plate 60 can be move down to a locked position when the knob 70 is rotated clockwise and upward to disengage with the guiding slot 704 when the knob 70 is rotated counterclockwise.

The fixing ring 80 is in a shape of orbicular and defines some retaining portion 801 at an inner circle thereof.

Referring to FIGS. 1-2, the insulative housing 30 is in a rectangular shape and has a receiving portion 304 at a middle thereof and four sidewalls 308 surrounding the receiving portion 304. The receiving portion 304 defines a supporting surface 305 adapted for receiving the chip module (not shown) and a mounting surface 306 opposite to the supporting surface 305 for mounting to the printed circuit board (not shown). A plurality of passageways (not labeled) displaced in matrix extending from the supporting surface 305 to the mounting surface 306 for receiving a plurality of terminals (not shown). Each terminal (not shown) is securely positioned into corresponding passageways (not shown). Each terminal (not shown) includes a contact engaging portion (not shown) extending beyond the supporting surface 305, and a soldering portion (not shown) extending beyond the mounting surface 306 and connecting a solder ball (not shown) for jointing the terminal (not shown) to the printed circuit board (not shown).

Figure 7:
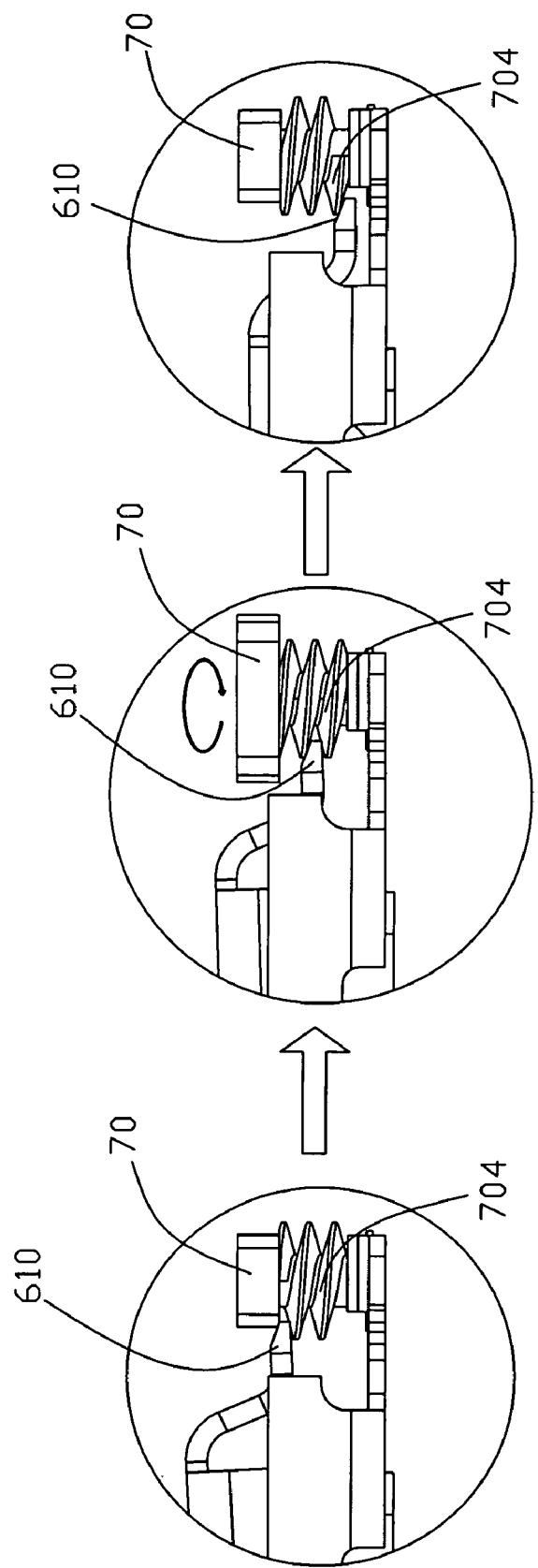
FIG. 7 is a sketch view showing a process of the knob engaging and locking the load plate.

Referring to FIGS. 2 and 5-7, in assembly of the electrical connector 100, the load plate 60 is attached to the fastening portion 5025 of the second main portion 5022 of the stiffener 50. The hooks 603 of the load plate 60 are retained in the fastening holes 5026 of the fastening portion 5025. When the knob 70 is assembled on the stiffener 50, the stem 702 of the knob 70 passes through a centre hole 5029 of the projecting portion 5028 and the bottom end of the stem 702 is retained by the fixing ring 80. Then rotate the load plate 60 to an open position, and then the insulative housing 30 assembled with a plurality of terminals (not shown) is installed in the opening 501 in the middle of the stiffener 50. After that, put the chip module (not shown) into the receiving portion 304 of the insulative housing 30. Then push down the load plate 60 to cover the chip module (not shown) particularly. Referring to FIG. 7, the front side of the tongue 610 of the load plate 60 is pressed to be received in the highest end of the guiding slot 704 of the knob 70. Turn the knob 70 in a clockwise rotation, and the tongue 610 of the load plate 60 can move along the guiding slot 704 downwardly. The tongue 610 of the load plate 60 is retained by a lowest end of the screwing stripes 703 when the tongue 610 of the load plate 60 moves to the lowest end of the guiding slot 704. And at this time the load plate 60 is at a closed position.

In this preferred embodiment of the present invention, the fastening device 90 retains the load plate 60 by rotating the knob 70 to force the tongue 610 of the load plate 60 to downwardly move and be fastened by the lowest end of the wrest stripes 703. Actually, the tongue 610 of the load plate 60 also can abut against the top surface of the stiffener 50 or the top surface of the projecting portion 5028 when the load plate 60 in the closed position. The fastening device 90 retains the load plate 60 by the knob 70 assembled on the stiffener 50. So the knob 70 replaces a lever in conventional electrical connector assembly and reduces an occupying area on the printed circuit board. In addition, the structure of the fastening device 90 is facilitated and a cost of manufacture of the electrical connector using the fastening device 90 is curtailed.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A fastening device for retaining a chip module to a printed circuit board, comprising:

an insulative housing having a plurality of terminals received therein;

a stiffener adapted for assembling on the printed circuit board, the stiffener defines a base having an opening for receiving an insulative housing;

a fixing ring located on a bottom of the stiffener for fastening a knob on the stiffener;

a pair of parallel lateral sides extending upwardly from the base; the base comprising first and second main portions; the first main portion for fastening the knob and the second main portion for joining with a load plate;

the load plate pivotally assembled to a first end of the stiffener, the load plate having a pressing side with a tongue; and a retaining side for attaching to the stiffener; and the load plate defines a pair of hooks corresponding to fastening portions for jointing the load plate with the stiffener; the base has a projecting portion, the projecting portion being offset from the base;

the knob having a stem rotationally assembled to a second end of the stiffener, and provided with a guiding slot helically defined along the stem such that the tongue of the load plate engaged with the guiding slot can be moved up and down when the knob is rotated clockwise and counterclockwise;

a stopper is formed between the two hooks for abutting against the stiffener to prevent the load plate from over rotation.

2. The fastening device as claimed in claim 1, wherein the knob comprises a driving portion located on the top end of the stem, the guiding slot is defined on a peripheral surface of the stem in a screwing shape, and the tongue of the load plate moves along the guiding slot downwardly.

3. The fastening device as claimed in claim 2, wherein the driving portion of the knob has a rectangular basic portion and an embowed end portion extending forwardly from the base portion.

4. The fastening device as claimed in claim 2, wherein the stem has a column bottom end, and the base of the load plate has the projecting portion defining a centre hole for the bottom end of the stem passing through.

5. The fastening device as claimed in claim 4, wherein a gap is formed between the projecting portion of the load plate and the printed circuit board for receiving a fixing ring for fastening the knob.

6. An electrical connector, for electrically connecting a chip module to a printed circuit board, comprising:

an insulative housing having a plurality of terminals received therein;

a stiffener adapted for assembling on the printed circuit board, comprising a base defining an opening for receiving the insulative housing;

fixing ring located on a bottom of the stiffener for fastening a knob on the stiffener;

a pair of parallel lateral sides extending upwardly from the base; the base comprising first and second main portions; the first main portion for fastening the knob and the second main portion for joining with a load plate;

the load plate pivotally assembled to a first end of the stiffener, the load plate having a tongue and a retaining side for attaching to the stiffener; and the load plate defines a pair of hooks corresponding to fastening portions for jointing the load plate with the stiffener; the base has a projecting portion, the projecting portion being offset from the base;

the knob having a stem rotationally assembled to a second end of the stiffener, and provided with a guiding slot helically defined along the stem such that the tongue of the load plate engaged with the guiding slot can be moved up and down when the knob is rotated clockwise and counterclockwise;

a stopper is formed between the two hooks for abutting against the stiffener to prevent the load plate from over rotation;

a soldering portion of the terminals extending beyond a mounting surface of the board and connecting a solder ball for jointing the terminal to the printed circuit board.

7. The electrical connector as claimed in claim 6, wherein one end of the stiffener to an end of the stiffener assembled the knob has a pair of parallel fastening portions extending upwardly.

8. The electrical connector as claimed in claim 6, wherein the knob comprises a driving portion located on the top end of the stem, the guiding slot is defined on a peripheral surface of the stem in a screwing shape, and the tongue of the load plate moves along the guiding slot downwardly.

9. The electrical connector as claimed in claim 8, wherein the driving portion of the knob has a rectangular base portion and an embowed end portion extending forwardly from the base portion.

10. The electrical connector as claimed in claim 8, wherein the stem has a column bottom end, and the base of the load plate has the projecting portion defining a centre hole for the bottom end of the stem passing through.

11. The electrical connector as claimed in claim 10, wherein a gap is formed between the projecting portion of the load plate and the printed circuit board for receiving a fixing ring for fastening the knob.

12. An electrical connector assembly for retaining a chip module to a printed circuit board, comprising:

an insulative housing having a plurality of terminals received therein;

a stiffener adapted for assembling on the printed circuit board, the stiffener defines a base having an opening for receiving an insulative housing;

a fixing ring located on a bottom of the stiffener for fastening a knob on the stiffener;

a pair of parallel lateral sides extending upwardly from the base; the base comprising first and second main portions; the first main portion for fastening the knob and the second main portion for joining with a load plate;

the load plate pivotally assembled to a first end of the stiffener, the load plate having a pressing side with a tongue; and a retaining side for attaching to the stiffener; and the load plate defines a pair of hooks corresponding to fastening portions for jointing the load plate with the stiffener; the base has a projecting portion, the projecting portion being offset from the base;

the knob having a stem rotationally assembled to a second end of the stiffener, and provided with a guiding slot helically defined along the stem such that the tongue of the load plate engaged with the guiding slot can be moved up and down when the knob is rotated clockwise and counterclockwise;

a stopper is formed between the two hooks for abutting against the stiffener to prevent the load plate from over rotation;

a gap is formed between the projecting portion of the load plate and the printed circuit board for receiving a fixing ring for fastening the knob.

13. The electrical connector assembly as claimed in claim 12, wherein said knob is equipped with threads to engage the free end of the load plate.

* * * * *